Figure 1:
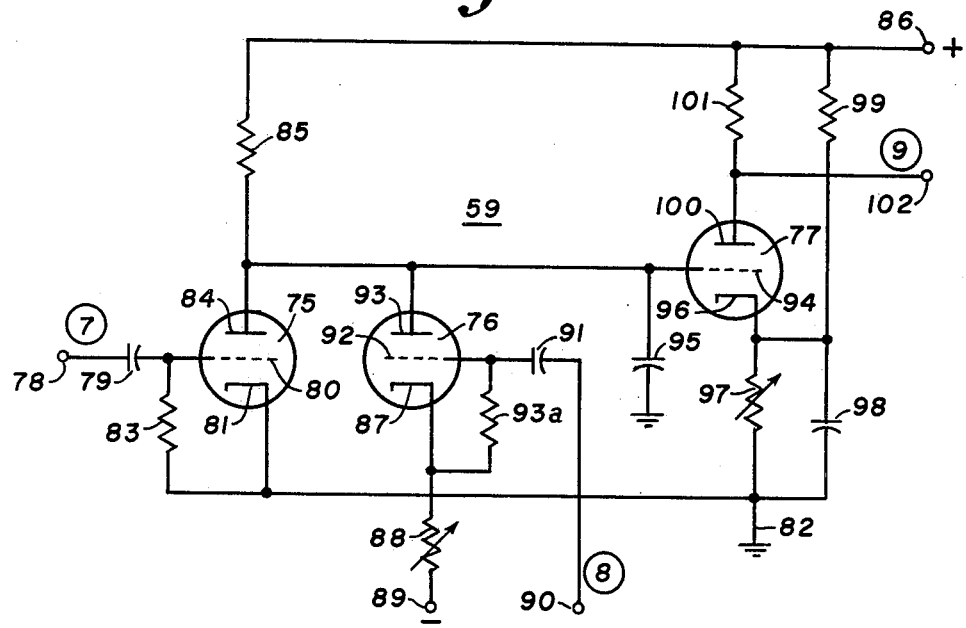

United States Patent [19]

McArdle et al.

[11] 4,337,436
[45] Jun. 29, 1982

[54] BLANKING WAVE GENERATOR FOR BINARY CODE SYNCHRONIZING SYSTEM

[75] Inventors: Beryl L. McArdle; Pierre J. Tapernoux, both of Rochester, N.Y.

[73] Assignee: General Dynamics Corporation, Electronics Division, San Diego, Calif.

[21] Appl. No.: 256,444

[22] Filed: Nov. 15, 1951

Related U.S. Application Data

[62] Division of Ser. No. 177,528, Aug. 3, 1950, abandoned.

[51] Int. Cl.³ .............................................. H03B 9/13
[52] U.S. Cl. .................................. 328/157; 340/825.57
[58] Field of Search .................. 250/27 PSC, 17.551, 250/17.555, 27 T, 27 PD; 332/9, 15; 178/82, 82 A, 82 R; 340/167, 345, 349, 353; 328/157

[56] References Cited

U.S. PATENT DOCUMENTS

| | | | |
|---|---|---|---|
| 2,274,829 | 3/1942 | Goddard | 332/15 |
| 2,404,306 | 7/1946 | Luck | 332/9 |
| 2,449,169 | 9/1948 | Kirkwood et al. | |
| 2,469,227 | 5/1949 | Fraser | |
| 2,479,947 | 8/1949 | Lord | |
| 2,566,056 | 8/1951 | Delvaux | |
| 2,597,013 | 5/1952 | Marchetti | |

FOREIGN PATENT DOCUMENTS 58121 8/1946 Netherlands ........................ 178/82

*Primary Examiner*—Howard A. Birmiel

EXEMPLARY CLAIM

1. A blanking wave generator comprising the combination of first and second sources of pulses operating in synchronism, said second pulse source having a lower pulse repetition frequency than said first pulse source, a first electron discharge device having a control electrode connected to said first pulse source, a second electron discharge device having a control electrode connected to said second pulse source, means for rendering said first discharge device conductive only upon receipt of a pulse from said first source of pulses, means for rendering said second discharge device conductive only upon receipt of a pulse from said second pulse source, a capacitor operatively connected to said first and second discharge devices, means including a source of potential and resistive means serially connected across said capacitor for charging said capacitor, said capacitor and resistive means having a time constant greater than zero but less than the repetition period of pulses from said first pulse source; means including said first discharge device for discharging said capacitor to a first voltage upon receipt of a pulse from said first pulse source, means including said second discharge device for discharging said capacitor to a second voltage when pulses are simultaneously received from both said pulse sources, a third electron discharge device having an anode, a cathode, and a control electrode connected to said capacitor; an anode-cathode circuit for said third electron discharge device; means for maintaining said third discharge device conductive when said capacitor is charged and non-conductive when said capacitor is discharged, said last named means including fixed bias on said cathode; and means responsive to interruption of current flow in said anode-cathode circuit of said third electron discharge device to develop an output pulse.

3 Claims, 2 Drawing Figures

BLANKING WAVE GENERATOR FOR BINARY CODE SYNCHRONIZING SYSTEM

This is a division of application Ser. No. 177,528, filed Aug. 3, 1950 and assigned to the same assignee as the present application and now abandoned.

This invention relates to blanking wave generators, and more particularly to a blanking wave generator having first and second sources of pulses operating in synchronism, the second pulse source having a lower pulse repetition frequency than the first pulse source. The blanking wave generator supplies an output pulse of a predetermined duration in response to an input pulse from the first pulse source only, and an output pulse of greater width in response to receipt of pulses from both of the pulse sources.

Although not limited thereto, the arrangements of the present invention are particularly adapted for use in communication systems of the type disclosed and claimed in application Ser. No. 131,436, Beryl L. McArdle, filed Dec. 6, 1949 and assigned to the same assignee as the present application.

It is an object of the present invention to provide an improved blanking wave generator of simple and reliable characteristics.

It is also an object of the present invention to provide an improved blanking wave generator which furnishes a pulse of predetermined width in response to the reciept of an input pulse from a first pulse source only, and to furnish a wider pulse when input pulses are received from first and second pulse sources operating in synchronism, with the second pulse source having a lower pulse repetition frequency than the first.

Further objects and advantages of the present invention will become apparent as the following description proceeds and the features of novelty which characterize the invention will be pointed out with particularity in the claims annexed to and forming a part of this specification.

Figure 2:
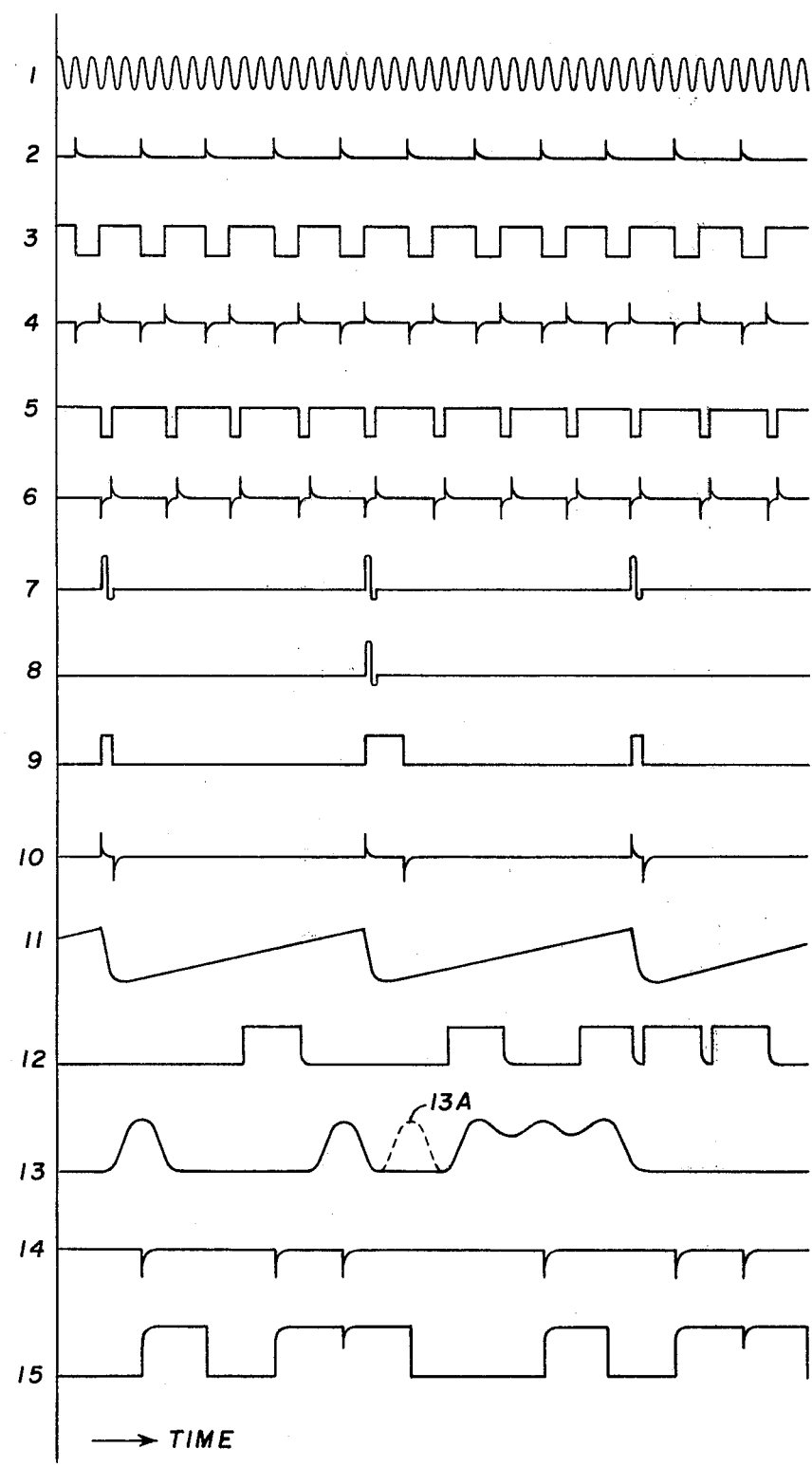

For a better understanding of the present invention, reference may be had to the accompanying drawing in which FIG. 1 is a schematic wiring diagram of a preferred embodiment of the present invention; and FIG. 2 is a graphical representation, to a common time base, of the waveforms which exist in the circuit of FIG. 1.

In the drawings the encircled reference numerals refer to the corresponding approximate curves or wave shapes of FIGS. 1 and 2.

Referring now to FIG. 1, generator 59 comprises a plurality of electron discharge devices 75, 76 and 77, preferably of the triode type. An input terminal 78 is coupled by a capacitor 79 to control electrode 80 of discharge device 75. Cathode 81 of device 75 is grounded as indicated at 82. A resistor 83 is connected between control electrode 80 and cathode 81. Anode 84 of discharge device 75 is connected through a resistor 85 to a suitable source of positive potential 86, the negative terminal of this source preferably being grounded.

Cathode 87 of discharge device 76 is connected through a resistor 88, which is preferably adjustable as indicated, to a suitable source of negative potential 89, the positive terminal of this potential source preferably being grounded. An input terminal 90 is coupled by means of a capacitor 91 to control electrode 92 of discharge device 76. A resistor 93a is connected between cathode 87 and control electrode 92. Anode 93 of discharge device 76 is connected to anode 84 of discharge device 75, and is also connected to control electrode 94 of discharge device 77. A capacitor 95 is connected between control electrode 94 and ground. Cathode 96 of discharge device 77 is connected to ground through a resistor 97, which is preferably adjustable as shown and which is shunted by a capacitor 98. A resistor 99 is connected between positive potential source 86 and cathode 96. Anode 100 of discharge device 77 is connected through a resistor 101 to positive potential source 86, and is also connected to an output terminal 102.

In operation, discharge devices 75 and 76 are normally non-conducting, since their control electrodes 80 and 92 are self-biased sufficiently negative, through grid rectification of pulse trains 7 and 8 respectively applied to input terminals 78 and 90 and to the resultant charging of capacitors 79 and 91. Discharge device 77 is normally conducting due to the fact that its control electrode 94 is returned through resistor 85 to positive potential source 86. During the occurrence time of each pulse represented by curve 7 at terminal 78, discharge device 75 becomes conductive and causes the discharge of capacitor 95, thus lowering the potential at control electrode 94 sufficiently to render discharge device 77 non-conducting. The time during which this discharge device remains cut off is determined by the time constant of resistor 85 and capacitor 95. A positive pulse appears at output terminal 102 (curve 9) at each time a pulse is applied at terminal 78, the duration of these pulses also being determined by the time constant of resistor 85 and capacitor 95.

The device thus far described constitutes a basic pulse widening arrangement. In order that the output pulses occurring at periodic intervals at output terminal 102 may be wider than those normally generated, discharge device 76 is provided. When a pulse train (curve 8) is applied to input terminal 90, discharge device 76 becomes conducting and, since its cathode 87 is returned to negative potential source 89 instead of to ground, capacitor 95 is discharged to a lower voltage than when discharge device 75 is conducting. A longer time is therefore required for discharge device 77 again to become conducting, with the result that an output pulse is produced at terminal 102 having a greater duration than the pulses there produced when only discharge device 75 conducts. The width of these wider pulses may be varied by adjusting the value of resistor 88.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

We claim:

1. A blanking wave generator comprising the combination of first and second sources of pulses operating in synchronism, said second pulse source having a lower pulse repetition frequency than said first pulse source, a first electron discharge device having a control electrode connected to said first pulse source, a second electron discharge device having a control electrode connected to said second pulse source, means for rendering said first discharge device conductive only upon receipt of a pulse from said first source of pulses, means for rendering said second discharge device conductive only upon receipt of a pulse from said second pulse source, a capacitor operatively connected to said first and second discharge devices, means including a source of potential and resistive means serially connected across said capacitor for charging said capacitor, said capacitor and resistive means having a time constant greater than zero but less than the repetition period of pulses from said first pulse source; means including said first discharge device for discharging said capacitor to a first voltage upon receipt of a pulse from said first pulse source, means including said second discharge device for discharging said capacitor to a second voltage when pulses are simultaneously received from both said pulse sources, a third electron discharge device having an anode, a cathode, and a control electrode connected to said capacitor; an anode-cathode circuit for said third electron discharge device; means for maintaining said third discharge device conductive when said capacitor is charged and non-conductive when said capacitor is discharged, said last named means including fixed bias on said cathode; and means responsive to interruption of current flow in said anode-cathode circuit of said third electron discharge device to develop an output pulse.

2. The combination of claim 1 in which said first and second electron discharge devices are each provided with a cathode, and said cathodes are maintained at different potentials.

3. The combination of claim 1 in which said first and second electron discharge devices are each provided with a cathode, said cathode of said first discharge device being returned to ground and said cathode of said second discharge device being returned to a source of negative potential.

* * * * *